US006246007B1

United States Patent
Tanaka et al.

(10) Patent No.: US 6,246,007 B1
(45) Date of Patent: Jun. 12, 2001

(54) OXIDE SUPERCONDUCTIVE WIRE AND PROCESS FOR MANUFACTURING THE SAME

(75) Inventors: Yoshiaki Tanaka, Ibaraki; Tomoyuki Yanagiya, Fujisawa; Fumiaki Matsumoto, Kashiwa; Masao Fukutomi, Abiko; Toshihisa Asano, Tsukuba; Kazunori Komori, Tsukuba; Hiroshi Maeda, Tsukuba, all of (JP)

(73) Assignees: Sumitomo Heavy Industries, Ltd., Tokyo; National Research Institute for Metals, Ibaraki, both of (JP)

( * ) Notice: Subject to any disclaimer, the term of this patent is extended or adjusted under 35 U.S.C. 154(b) by 0 days.

(21) Appl. No.: 08/856,699

(22) Filed: May 15, 1997

Related U.S. Application Data

(62) Division of application No. 08/170,959, filed on Dec. 21, 1993, now Pat. No. 5,663,528.

(30) Foreign Application Priority Data

Dec. 22, 1992 (JP) .................................................. 4-356760

(51) Int. Cl.[7] .................................................. H01L 39/24
(52) U.S. Cl. ...................... 174/125.1; 505/121; 505/230; 505/239; 505/430; 505/492; 505/501
(58) Field of Search ........................ 174/125.1; 505/100, 505/121, 220, 230, 239, 430, 492, 501, 782, 813, 884, 887

(56) References Cited

U.S. PATENT DOCUMENTS

| | | |
|---|---|---|
| 4,866,032 | 9/1989 | Fujimori et al. ...................... 505/476 |
| 4,906,609 | 3/1990 | Yamauchi et al. .................... 505/433 |
| 4,952,554 * | 8/1990 | Jin et al. ............................... 505/230 |
| 5,075,285 | 12/1991 | Flükiger ............................... 505/230 |
| 5,104,849 | 4/1992 | Shiga et al. .......................... 505/231 |
| 5,194,420 | 3/1993 | Akihama .............................. 505/124 |
| 5,384,307 | 1/1995 | Lay ....................................... 505/430 |

OTHER PUBLICATIONS

Yamada et al., "Pb Introduction to the High–Tc Superconductor Bi–Sr–Ca–Cu–O", *Japanese Journal of Applied Physics*, vol. 27, No. 6, Jun. 1988, pp. L996–L998.

Iwai et al., Formation of the High–$T_c$ Phase of $Bi_{1-x}Pb_xSr_{0.90}Ca_{1.10}Cu_{1.50}O_y$, ($0 \leq x \leq 0.05$), *Japanese Journal of Applied Physics*, vol. 28, No. 9, Sep. 1989, pp. L1518–L1520.

* cited by examiner

*Primary Examiner*—Albert W. Paladini
(74) *Attorney, Agent, or Firm*—McDermott, Will & Emery

(57) ABSTRACT

A clad superconductive wire or tape of an oxide superconductive material and a silver-copper alloy base containing 0.05–90 atomic % copper or a silver alloy. The silver-copper alloy base contains one or more elements selected from the group of Zr, Hf, Al, V, Nb and Ta in amounts of from 0.01–3 atomic %, or contains Au in amount of 0.01–10 atomic %. The silver alloy contains one or more elements selected from the group of Ti, Zr, Hf, V, Nb, Ta, Mg, Ca, Sr and Ba in amounts of from 0.01 to 3 atomic %, or one or more elements selected from the group of Au, Al, Ga, In and Sn in amounts of 0.05 to atomic %. The base material is filled with a Bi-containing oxide of $Bi_1Pb_uSr_xCa_yCu_zO_w$ wherein u=0–0.3, X=0.8–1.2, y=0.2–1.2, and z=0.8–2.0, and processed to obtain a superconductive wire or tape having enhanced mechanical strength, superconductivity and plastic workability.

6 Claims, 4 Drawing Sheets

| COMPONENTS OF BASE ALLOY MATERIAL | AFTER 90% PROCESSING | AFTER ANNEALING |
|---|---|---|
| PURE Ag | 100 | 70 |
| Ag-0.5at%V | 130 | 105 |
| Ag-7at%Cu-2at%Al | 160 | 135 |
| Ag-7at%Cu-3at%Nb | 160 | 120 |
| Ag-7at%Cu-3at%Au | 125 | 100 |
| Ag-0.2at%Zr | 130 | 100 |
| Ag-0.2at%Hf | 140 | 115 |
| Ag-0.8at%Ti | 135 | 105 |

FIG. 3

| COMPONENTS OF BASE ALLOY MATERIAL | AFTER 90% PROCESSING | AFTER ANNEALING |
|---|---|---|
| PURE Ag | 100 | 70 |
| Ag-0.5at%V | 130 | 105 |
| Ag-7at%Cu-2at%Al | 160 | 135 |
| Ag-7at%Cu-3at%Nb | 160 | 120 |
| Ag-7at%Cu-3at%Au | 125 | 100 |
| Ag-0.2at%Zr | 130 | 100 |
| Ag-0.2at%Hf | 140 | 115 |
| Ag-0.8at%Ti | 135 | 105 |

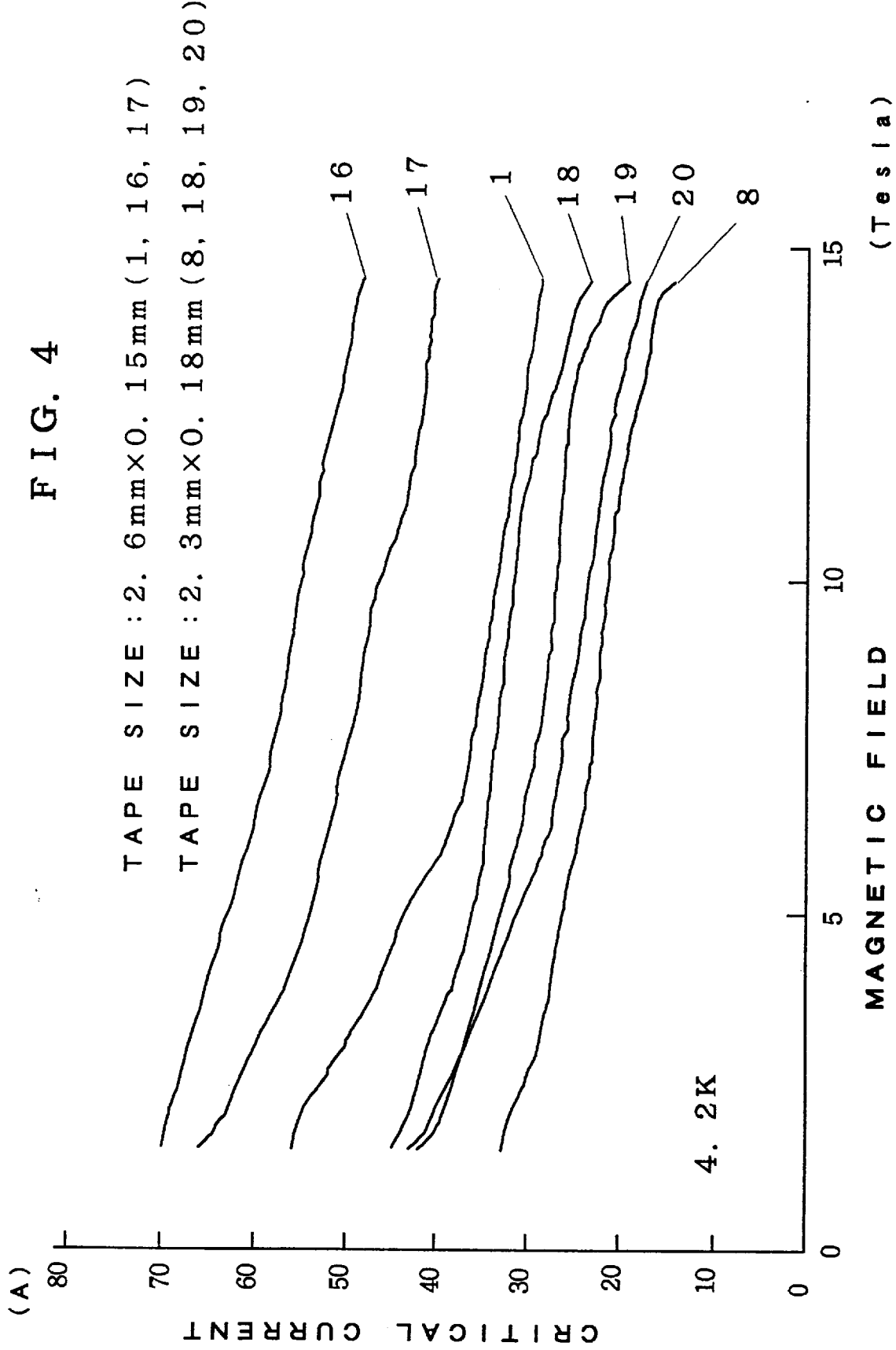

OXIDE SUPERCONDUCTIVE WIRE AND PROCESS FOR MANUFACTURING THE SAME

This application is a divisional application of Ser. No. 08/170,959 filed Dec. 21, 1993 now U.S. Pat. No. 5,663,528.

BACKGROUND OF THE INVENTION

1. Field of the Invention

The present invention relates to oxide-superconductive wires and a process for manufacturing the same. In particular, the present invention relates to novel oxide superconductive wires and tapes which have improved mechanical strength and excellent superconductive properties, and also to a process for manufacturing such superconductive wires and tapes.

2. Description of the Related Art

Hitherto, various studies have been performed on oxide superconductors containing yttrium (Y), bismuth (Bi) and the like in order to enhance superconductive properties, in particular, characteristics of the JC (the critical current density), and various processes for the manufacture have been proposed.

For example, a composite processing in which starting materials, oxide powders, are filled in a sheath made of pure silver, and subjected to a plasticity processing and a sintering treatment; and a paste method in which oxides in a paste form are applied onto a pure silver base, dried and subjected to a thermal processing are known.

Among such processes, a so-called composite wire processing is regarded as a leading process in the manufacture of superconductive wires containing oxides of Bi. According to this process, the starting Bi-based oxides which had been pre-sintered in air are filled in a pure silver sheath, and then subjected to a plasticity processing to obtain thin wires having various sectional forms. The thin wires thus obtained are rolled into tapes and sintered at a high temperature to produce superconductive wires.

These conventional methods are advantageous in improving the characteristics of the critical current density due to the use of pure silver as a base material such as sheath and the like. However, pure silver materials generally have a low mechanical strength. This causes drawbacks in that when pure silver materials are processed together with starting powder oxides and the like, irregular deformation in the longitudinal direction, which is called sausaging and uneven wall thickness in the cross-section of the wire takes place, which results in clustering of the oxides inside the sheath and breaking of wire.

There is another problem in that the surface matching between the pure silver base material and the bordering oxide layer is not satisfactory.

These problems invite deteriorating superconductive properties, poor characteristics of the critical current density and unreliability.

The above-mentioned composite wire processing which is expected as a promising process for manufacturing oxide-type superconductive wires is not an exception, and involves a drawback in that the silver sheath is softened by the thermal treatment of 800 to 900° C. due to the low melting point of silver. The softened silver sheath is easily deformed plastically under a coiling work of superconductive magnets at room temperature, which raises a problem of unrestorable deterioration of superconductive characteristics.

In order to solve the problems in the mechanical strength, reinforcing or supporting materials have conventionally been employed. In this case, however, critical current density per unit wire cross-section is reduced, which is unfavorable because it hinders a manufacturing of compact and light superconductor apparatus.

Under the above circumstances, the present inventors have conducted earnest studies in an attempt to overcome drawbacks involved in conventional processes for producing superconductive wires where pure silver is used as a base material of a sheath and the like, and to provide a process for producing oxide superconductive wires which have excellent mechanical strength, superconductivity and improved plastic workability, leading to completion of the invention.

SUMMARY OF THE INVENTION

Accordingly, an object of the present invention is to provide an oxide superconductive wire which comprises a base and an oxide superconductive material, said base is composed of a silver alloy and/or a silver-copper alloy.

Another object of the present invention is to provide an oxide superconductive wire which comprises a base and an oxide superconductive material, said base is composed of a silver alloy and/or a silver-copper alloy, which is obtained by first making a clad composed of the base and oxide superconductive material, and then subjected to known treatment including thermal treatment.

A further object of the present invention is to provide a process for producing an oxide superconductive wire which comprises a base and an oxide superconductive material, wherein a silver alloy and/or a silver-copper alloy are served as a base material and prepared into a clad together with an oxide superconductive materials.

The above and other objects, features and advantages of the present invention will become apparent from the following description.

BRIEF DESCRIPTION OF THE DRAWINGS

FIG. 3 is a table showing micro-Vickers hardness for various base alloy materials according to the present invention.

FIG. 4 shows superconductivity measured on various samples according to the present invention.

DETAILED DESCRIPTION OF THE INVENTION AND PREFERRED EMBODIMENTS

Figure 1:
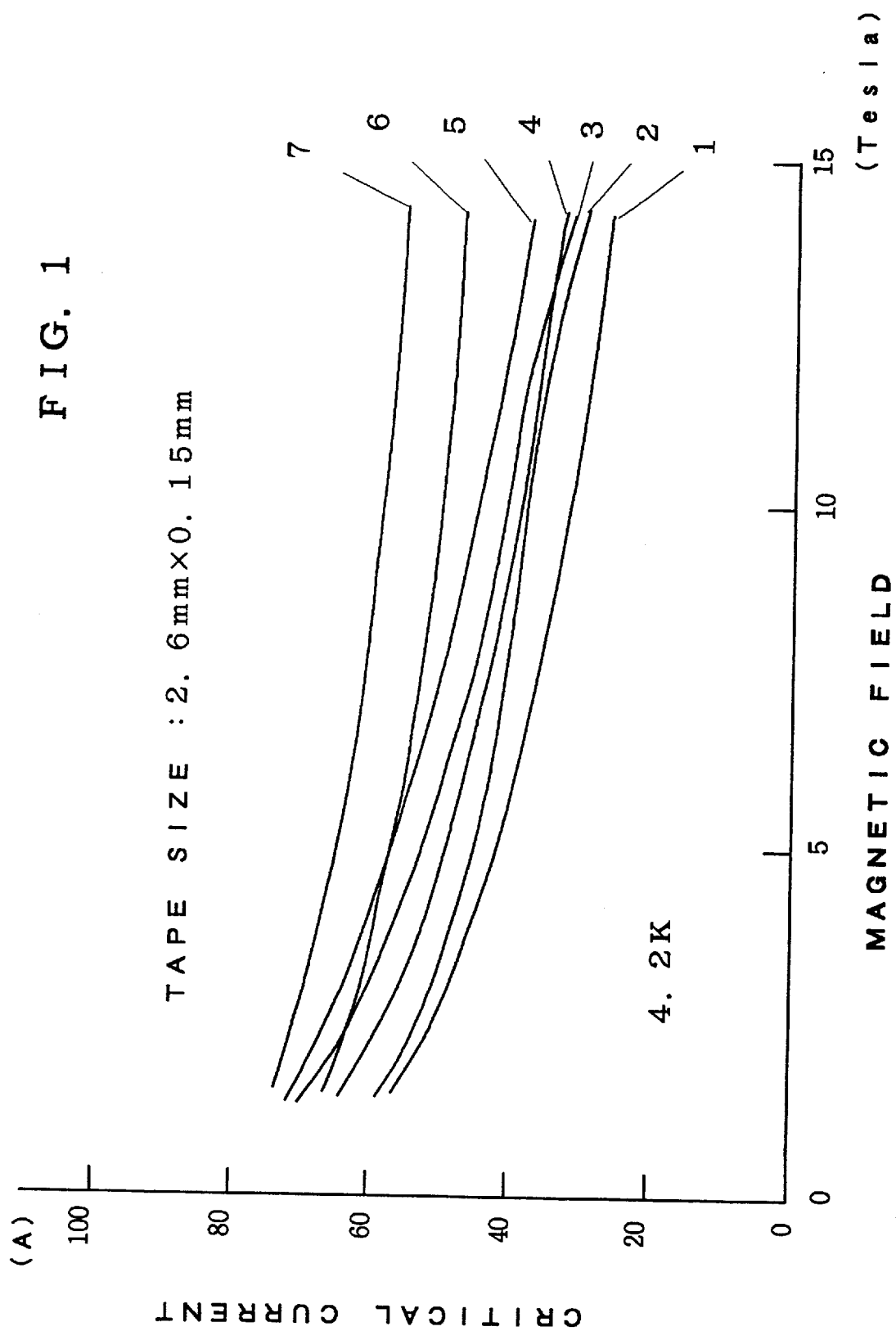
FIG. 1 shows the magnetic field dependence of critical current value for wire materials in Example 1.

In the present invention, when a silver-copper alloy is used as a base material of oxide superconductive wires, the content of copper in the alloy is preferably from 0.05 to 90 atomic %. The elements which can be added into the silver-copper alloy of the base material include Bi, Sr, Ca, Mg, Ba, Ti, Y, Zr, Hf, Al, V, Nb, Ta, Au and the like. These additional elements must be suitably selected and incorporated in proper amounts.

For example, when Bi-containing oxide superconductive material is used, one or more elements selected from the group consisting of Bi, Sr, Ca, Mg, Ba and Ti are incorporated in amounts from 0.05 to 5 atomic % in total into the silver-copper alloy base. When Y-containing oxide superconductive material is used, one or more elements selected from the group consisting of Y, Ba, Mg and Ti are incorporated in amounts from 0.05 to 5 atomic % in total into the alloy base. Superconductive wires making use of these base materials have an enhanced mechanical strength and excellent superconductive properties.

The silver-copper alloy base preferably contains one or more elements selected from the group consisting of Zr, Hf, Al, V, Nb and Ta in amounts of 0.01 to 3 atomic % in total, or alternatively, contains Au in amounts of 0.01 to 10 atomic %. When a silver-copper alloy base addded with Zr, Hf or Al is used, improvement in the mechanical strength and superconductivity of the wire product is expected similar to the case when Bi, Sr, Ca, Ba, Y and the like are added as described above.

If V, Nb, Ta or Au are added to the base material made of silver-copper alloy, plastic workability is markedly improved in addition to the improvement in the mechanical strength and superconductivity. Improvement in the plastic workability is remarkable especially when Au is added.

By the use of a silver-copper alloy made by adding copper and the like elements into silver as a base material of tubes and base plates, mechanical strength is enhanced and in particular, in the case of clad wire materials, the sectional form or profile thereof can be made uniform. Also, good matching between the starting powder oxide and the base material is obtained in a working step, and therefore, uniform deformation of the oxide layer is obtained in the longitudinal direction of the wire and in the cross-section of the wire. Therefore, clustering of oxides and breaking of wire, which could not be avoided by conventional processes can now be prevented.

In the present invention, when a silver alloy is used as a base material of oxide superconductive wires, the base material may be added with Ti, Zr, Hf, V, Nb, Ta, Mg, Ca, Sr, Ba, Au, Al, Ga, In, Sn and the like elements. It is necessary that these elements be suitably selected, and amounts of the elements be suitably determined.

For example, it is preferable that a silver-alloy base material contains one or more elements selected from the group consisting of Ti, Zr, Hf, V, Nb, Ta, Mg, Ca, Sr and Ba, in amounts of 0.01 to 3 atomic % in total.

When additional elements are selected from the group consisting of Au, Al, Ga, In and Sn, the amounts of one or more elements selected therefrom are preferably 0.05 to 5 atomic % in total. The thus produced superconductive wires have enhanced mechanical strength and superconductivity.

In both cases of using silver-copper alloy base materials and silver alloy base materials, production of oxide superconductive material is promoted by additional elements incorporated therein. In addition, good interfacial connection is obtained between the base materials such as tubes or base plates and the surface of the oxide layer. The characteristics of critical current density are significantly improved and their variation is reduced. However, it is necessary that selection of elements to be added and base materials for combination, and amounts of elements to be added be carefully determined. If excessive amounts of elements are added, they will diffuse in the oxide layer during the sintering or heat treatment processes, which will mar the superconductive characteristics, or the alloys have excessive hardness which causes difficult processing into wires, resulting in cracks and rough surfaces of the obtained wires.

For example, if silver alloy base materials are used and a single additional element is added thereto, the maximal amount of such a single element selected from Ti, Zr and Hf is preferably about 5 atomic %, a single element selected from V, Nb and Ta is about 8%, and a single element selected from Mg, Ca, Sr and Ba is about 4 atomic %. If a plurality of elements are selected from these, the total amount of the elements is restricted to be not more than 3 atomic %. When one or more elements selected from the group consisting of Au, Al, Ga, In and Sn are used, the total amounts are restricted to not more than 10 atomic % from the same reason.

If silver-copper alloy base materials are used and a single element is added thereto, the maximal amount of such a single element selected from Zr and Hf is preferably about 4 atomic %, a single element selected from V, Nb and Ta is about 5%, a single element of Au is about 15 atomic %, and a combination of elements selected from the group consisting of Zr, Hf, V, Nb and Ta is about 3 atomic % in total. When Au is incorporated together with other additional elements, the maximal amount of Au does not exceed 10 atomic %. When these conditions are met, remarkable effects (not less than 1.3 fold with respect to critical current characteristics and not less than 1.2 fold with respect to mechanical strength) can be obtained.

It should also be noted that too little amount of additional elements cannot achieve improvement in the mechanical strength and superconductive characteristics of the obtained material. In this sense, the minimal amount of the additional elements is considered to be 0.01 atomic % for each element. When these conditions are met, remarkable effects (not less than 1.3 fold with respect to critical current characteristics and not less than 1.2 fold with respect to mechanical strength) can be obtained.

For example, if silver-copper alloy base materials containing 50 atomic % of copper are used, effects equivalent to or higher than those obtainable from pure silver materials are obtained when the amounts of Zr, Hf, Al, V, Nb and Ta fall in the following ranges: 0.005 atomic % <Zr<5.0 atomic %, 0.005 atomic % <Hf<4.6 atomic %, 0.005 atomic % <Al<4.0 atomic %, 0.005 atomic % <V<5.0 atomic %. In particular, when the amounts fall in the range of 0.01 to 3 atomic %, remarkable effects (not less than 1.3 fold with respect to critical current characteristics and not less than 1.2 fold with respect to mechanical strength) can be obtained.

If silver-copper alloy base materials containing 50 atomic % of copper are used, effects equivalent to or higher than those obtainable from pure silver materials are obtained when the amounts of Au fall in the range of 0.008 atomic % <Au<16.0 atomic %. In particular, when the amounts fall in the range of 0.01 to 10 atomic %, remarkable effects (not less than 1.3 fold with respect to critical current characteristics and not less than 1.2 fold with respect to mechanical strength) can be obtained.

Preferable oxide superconductive materials which are used in the present invention include Bi-containing oxides. The chemical formula of the Bi-containing oxides is $Bi_1Pb_uSr_xCa_yCu_zO_w$. Among such oxides, those in which u=0–0.03, x=10.8–1.2, y=0.2–1.2 and z=0.8–2.0 are preferred. If these ranges of parameters are greatly deviated, formation of superconductive oxides may be impeded.

In order to produce superconductive wires of the present invention by the use of the above-mentioned silver-copper alloys or silver alloys together with superconductive oxides, first, the alloys are formed into any arbitrary forms such as tubes, wires and tapes and the like to prepare a base material. Subsequently, this base material is filled with, applied onto or printed with a starting superconductive oxide for combination.

The thus obtained composite or combined material is further processed by extrusion, rolling, wire drawing, pressing and the like to have desired forms such as wires and tapes. Subsequently, thermal treatments are performed. Conditions of the thermal treatments are those known in the art. Processing and thermal treatments can be repeatedly performed.

The above-described process can also be applied for the production of various oxide superconductive wires such as T1-containing superconductive wires besides Bi- or Y-containing oxide superconductive wires.

EXAMPLES

The present invention will now be described in detail by way of Examples, which however, should not be construed as limiting the invention thereto.

Example 1

Various Bi-containing low Tc-phase superconducting tapes sheathed with materials of an Ag-base or an AgCu-base were prepared and their superconductive critical current values were compared. A mixed powder containing $Bi_2O_3$, $SrCO_3$, $CaCO_3$ and CuO powders in a proportion of Bi:Sr:Ca:Cu=2:2:1:2 was pre-sintered at 820° C. for 20 hours, furnace-cooled and crushed in a ball mill, and this entire procedure was repeatedly performed to obtain a pre-sintered powder. The thus obtained presintered powder was heated at 660° C. for 8 hours under the pressure of about ½ atm to prepare a starting powder.

The thus obtained starting powder was filled in each of the following tubes each having an outside diameter of 8 mm, inside diameter of 5.7 mm and a length of 30 mm with one end closed: pure silver tube, Ag-10 at %Cu-6 at %Au tube, Ag-10 at %Cu-0.9 at %Hf tube, Ag-0.8 at %Ta tube, Ag-0.5 at %Mg tube, Ag-0.5 at %Ba tube, and Ag-0.5 at %Ca tube. Thereafter, the tubes were sealed with pure silver plugs.

The thus charged tubes were processed by swaging and round wire-drawing to have an outside diameter of 1.1 mm, and roll-processed under a flat roll to finally have a thickness of 0.2 mm. From the thus obtained respective tapes, samples having a length of about 200 mm were cut out.

The tape samples were each subjected to a thermal treatment at a heat elevation rate of about 20° C./hour up to 880° C. in maximum, and maintained the elevated temperature for 30 minutes, followed by lowering the temperature to 825° C. at a rate of 5° C./hour, and maintained the temperature for 2 hours. Subsequently, the samples were taken out of the furnace and allowed to cool to obtain wire samples.

Superconductive critical current characteristics were measured on each wire sample. The results are shown in FIG. 1. FIG. 1 shows correlations of magnetic field and critical current of wire materials. In FIG. 1, numerals 1 to 7 indicate as follows:

1: pure silver tape,
2: Ag-0.5 at %Ca tape,
3: Ag-0.5 at %Ba tape,
4: Ag-0.8 at %Ta tape,
5: Ag-0.5 at %Mg tape,
6: Ag-10 at %Cu-0.9 at %Hf tape and
7: Ag-10 at %Cu-6 at %Au tape.

Example 2

Various Bi-containing high Tc-phase Ag base sheath tapes and AgCu base sheath tapes were prepared and their superconductive critical current values were compared. A mixed powder containing $Bi_2O_3$, PbO, $SrCO_3$, $CaCO_3$ and CuO powders in a proportion of Bi:Pb:Sr:Ca:Cu=1.8:0.4:2:2.1:3 was pre-sintered at 800° C. for 10 hours, furnace-cooled, crushed in a ball mill, and this entire procedure was repeatedly performed to obtain a pre-sintered powder.

The thus obtained starting powder was filled in each of the below described various tubes each having an outside diameter of 8 mm, an inside diameter of 5.7 mm and a length of 30 mm with one end closed: pure silver tube, Ag-7 at %Cu3 at %Au tube, Ag-7 at %Cu-2 at %Al tube, Ag-7 at %Cu-3 at %Nb tube, Ag-0.8 at %Ti tube, Ag-0.2 at %Zr tube, Ag-0.2 at %Hf tube and Ag0.5 at %V tube. Thereafter, the tubes were sealed with pure silver plugs.

The thus prepared charged tubes were processed by swaging and round wire-drawing to have an outside diameter of 1.1 mm, and roll-processed under a flat roll to finally have a thickness of 0.25 mm. From the thus obtained respective tapes, samples having a length of about 60 mm were cut out.

The tape samples were each subjected to a thermal treatment at a heat elevation rate of about 20° C./hour up to 830° C. in maximum, and sintered for 80 hours. The tapes were then rolled under a flat roll to have a thickness of 0.18 mm at room temperature, followed by sintering for 50 hours at 830° C. again. Thereafter, the materials were allowed to cool in the furnace to obtain wire samples.

Figure 2:
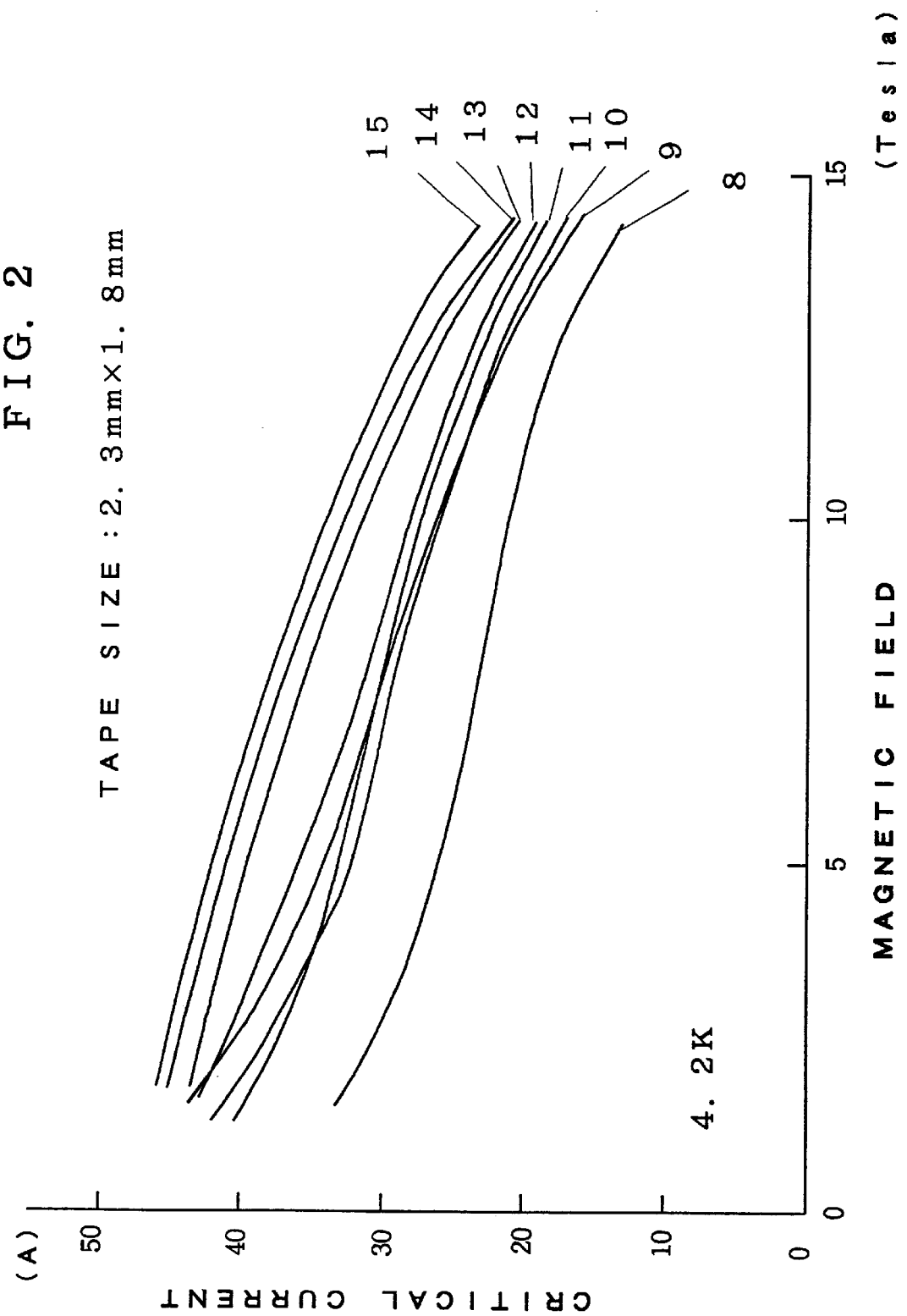
FIG. 2 shows the magnetic field dependence of critical current value for wire materials in Example 2.

Superconductive critical current characteristics were measured on each wire sample. The results are shown in FIG. 2. FIG. 2 shows correlations of magnetic field and critical current of wire materials in this Example. In FIG. 2, numerals 11 to 18 indicate the following:

11: pure silver tape,
12: Ag-0.5 at %V tape,
13: Ag-7 at %Cu-2 at %Al tape,
14: Ag-7 at %Cu-3 at %Nb tape,
15: Ag-7 at %Cu-3 at %Au tape,
16: Ag-0.2 at %Zr tape,
17: Ag-0.2 at %Hf tape, and
18: Ag-0.8 at %Ti tape.

Micro-Vickers hardness of the alloy bases was measured using these wire samples. The results are shown in FIG. 3.

Example 3

Various Bi-containing low Tc-phase and high Tc-phase Ag base alloy sheath tapes were prepared and their superconductive critical current values were compared. A mixed powder containing $Bi_2O_3$, $SrCO_3$, $CaCO_3$ and CuO powders in a proportion of Bi:Sr:Ca:Cu=2:2:1:2 was pre-sintered at 820° C. for 20 hours, furnace-cooled and crushed-in a ball mill, and this entire procedure was repeatedly performed to obtain a pre-sintered powder. The thus obtained pre-sintered powder was heated at 660° C. for 8 hours under the pressure of about ½ atm to prepare a starting powder for a Bi-containing low-Tc phase tape. Separately, a mixed powder containing $Bi_2O_3$, PbO, $SrCO_3$, $CaCO_3$ and CuO powders in a proportion of Bi:Pb:Sr:Ca:Cu=1.8:0.4:2:2.1:3 was pre-sintered at 800° C. for 10 hours, furnace-cooled and crushed in a ball mill, and this entire procedure was repeatedly performed to obtain a pre-sintered powder for a Bi-containing high-Tc phase tape.

The thus obtained starting Bi-containing low-Tc phase powder was filled in each of the following tubes each having an outside diameter of 8 mm, inside diameter of 5.7 mm and a length of 30 mm with one end closed: pure silver tube, Ag0.6 at %Au tube and Ag-0.8 at %Ga tube. The starting Bic-ontaining high-Tc phase powder was filled in each of the following tubes each having an outside diameter of 8 mm, inside diameter of 5.7 mm and a length of 30 mm with one end closed: pure silver tube, Ag-0.5 at %Al tube, Ag-5 at %Sn tube and Ag-7 at %In tube. Thereafter, the tubes were sealed with pure silver plugs.

The thus charged tubes were processed by swaging and round wire-drawing to have an outside diameter of 1.1 mm, and roll-processed under a flat roll to finally have a thickness of 0.15 mm in case of Bi-containing low-Tc phase tapes, and a thickness of 0.25 mm in case of Bi-containing high-Tc phase tapes. From the thus obtained respective tapes, samples having a length of about 200 mm were cut out.

The low-Tc phase tape samples were each subjected to a thermal treatment at a heat elevation rate of about 20° C./hour up to 880° C. in maximum, and maintained the elevated temperature for 30 minutes, followed by lowering the temperature to 825° C. at a rate of 5° C./hour, and maintained the temperature for 2 hours. Subsequently, the samples were taken out of the furnace and allowed to cool to obtain wire samples. Separately, each of high-Tc phase tape samples was subjected to a thermal treatment at a heat elevation rate of about 20° C./hour up to 830° C. in maximum, and subjected to a thermal treatment for 80 hours. Subsequently, the sample tapes were roll-processed under a flat roll to have a thickness of 0.18 mm at room temperature, and sintered again at 830° C. for 50 hours, followed by furnace-cooling to obtain wire samples.

Superconductivity was measured on each wire sample. The results are shown in FIG. 3. FIG. 3 shows correlations of magnetic field and critical current of wire materials. In FIG. 3, respective numerals indicate as follows:

1: pure silver low-Tc phase tape,

8: pure silver high-Tc phase tape,

16: Ag-0.6 at %Au low-Tc phase tape,

17: Ag-0.8 at %Ga low-Tc phase tape,

18: Ag-0.5 at %Al high-Tc phase tape,

19: Ag-5 at %Sn high-Tc phase tape, and

20: Ag-7 at %In high-Tc phase tape.

As described above, the process according to the present invention can produce oxide superconductive wire materials which have a base having enhanced mechanical strength and excellent superconductivity. Among various superconductive characteristics, characteristics of the critical current density can notably be enhanced, in particular. Furthermore, thermal treatment time can be shortened according to the process of the present invention. In case where silver-copper alloy base materials are used, addition of V, Nb, Ta and Au can markedly improve the mechanical strength, superconductive properties and plastic workability. Since superconductive wires produced according to the present invention are excellent in mechanical strength and in plastic workability and have high critical current density characteristics, they are useful as wire materials for magnets.

Furthermore, due to improvement in the critical current density and mechanical strength achieved by the invention, the size of apparatus containing superconductive devices can be minimized, and lightened. Moreover, further effects of stabilizing the functions of superconductive apparatus can be expected.

What is claimed is:

1. A clad oxide superconductive wire or tape comprising an oxide superconductive material and a base, wherein said base is a silver alloy containing one or more elements selected from the group consisting of Hf, V, Nb, and Ta in amounts of from 0.01–3 atomic % in total.

2. A process for preparing a clad oxide superconductive wire or tape comprising an oxide superconductive material and a base, wherein said base is a silver alloy containing one or more elements selected from the group consisting of Hf, V, Nb, and Ta in amounts of from 0.01–3 atomic % in total, which process comprises forming a composite of the oxide superconductive material and base, shaping the composite to form a wire or tape, and heating the wire or tape.

3. A clad oxide superconductive wire or tape comprising an oxide superconductive material and a base, wherein said base is a silver alloy and a single additional element Hf is incorporated therein in an amount of 0.01 to about 5 atomic %.

4. A clad oxide superconductutive wire or tape, comprising an oxide superconductive material and a base, wherein said base is a silver alloy and a single additional element selected from among V, Nb, and Ta is incorporated in an amount of 0.1 to about 8 atomic %.

5. A process for preparing a clad oxide superconductive wire or tape comprising an oxide superconductive material and a base, wherein said base is a silver alloy and a single additional element Hf is incorporated therein in an amount of 0.01 to about 5 atomic %, which process comprises forming a composite of the oxide superconductive material and base, shaping the composite to form a wire or tape, and heating the wire or tape.

6. A process for preparing a clad oxide superconductive wire or tape comprising an oxide superconductive material and a base, wherein said base is a silver alloy and a single additional element selected from among V, Nb, and Ta is incorporated in an amount of 0.1 to about 8 atomic %, which process comprises forming a composite of the oxide superconductive material and base, shaping the composite to form a wire or tape, and heating the wire or tape.

* * * * *